United States Patent
Ueda et al.

(10) Patent No.: US 10,790,308 B2
(45) Date of Patent: Sep. 29, 2020

(54) FIELD-EFFECT TRANSISTOR, DISPLAY ELEMENT, IMAGE DISPLAY DEVICE, AND SYSTEM

(71) Applicants: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(72) Inventors: Naoyuki Ueda, Kanagawa (JP); Yuki Nakamura, Tokyo (JP); Yukiko Abe, Kanagawa (JP); Shinji Matsumoto, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: Ricoh Company, Ltd., Tokyo (JP)

(*) Notice: Subject to any disclaimer, the term of this patent is extended or adjusted under 35 U.S.C. 154(b) by 0 days.

(21) Appl. No.: 16/131,593

(22) Filed: Sep. 14, 2018

(65) Prior Publication Data
US 2019/0027508 A1    Jan. 24, 2019

Related U.S. Application Data

(63) Continuation of application No. PCT/JP2017/010747, filed on Mar. 16, 2017.

(30) Foreign Application Priority Data

Mar. 18, 2016  (JP) ................ 2016-055571
Aug. 10, 2016  (JP) ................ 2016-157920

(51) Int. Cl.
*H01L 27/12*     (2006.01)
*H01L 29/786*    (2006.01)
(Continued)

(52) U.S. Cl.
CPC .......... *H01L 27/1225* (2013.01); *G09F 9/30* (2013.01); *H01L 27/124* (2013.01);
(Continued)

(58) Field of Classification Search
CPC .... G02F 1/136286; G02F 1/1368; G02F 1/15; G09F 9/30; H01L 27/1225
(Continued)

(56) References Cited

U.S. PATENT DOCUMENTS 8,692,252 B2     4/2014  Takata et al.
2010/0314618 A1* 12/2010 Tanaka .............. H01L 21/02554
                                                257/43
(Continued)

FOREIGN PATENT DOCUMENTS

JP       4164562       8/2008
JP    2010-16348 A     1/2010
(Continued)

OTHER PUBLICATIONS

Combined Russian Office Action and Search Report dated Apr. 23, 2019, in Patent Application No. 2018136357/28(060128), citing documents AA-AB and AO-AP therein, 21 pages (with English translation).
(Continued)

*Primary Examiner* — Long K Tran
(74) *Attorney, Agent, or Firm* — Oblon, McClelland, Maier & Neustadt, L.L.P.

(57) ABSTRACT

A field-effect transistor including: a gate electrode, which is configured to apply gate voltage; a source electrode and a drain electrode, which are configured to transfer an electrical signal; an active layer, which is formed between the source electrode and the drain electrode; and a gate insulating layer, which is formed between the gate electrode and the active layer, the active layer including at least two kinds of oxide
(Continued)

layers including layer A and layer B, and the active layer satisfying at least one of condition (1) and condition (2) below:

condition (1): the active layer includes 3 or more oxide layers including 2 or more of the layer A; and condition (2): a band-gap of the layer A is lower than a band-gap of the layer B and an oxygen affinity of the layer A is equal to or higher than an oxygen affinity of the layer B.

15 Claims, 9 Drawing Sheets

(51) Int. Cl.
| | |
|---|---|
| H05B 33/14 | (2006.01) |
| H05B 33/02 | (2006.01) |
| G09F 9/30 | (2006.01) |
| H01L 27/32 | (2006.01) |
| H01L 29/417 | (2006.01) |
| H01L 29/423 | (2006.01) |
| G02F 1/1362 | (2006.01) |
| G02F 1/1368 | (2006.01) |
| G02F 1/15 | (2019.01) |

(52) U.S. Cl.
CPC ...... *H01L 27/1229* (2013.01); *H01L 27/3276* (2013.01); *H01L 29/41733* (2013.01); *H01L 29/42384* (2013.01); *H01L 29/7869* (2013.01); *H01L 29/78687* (2013.01); *H01L 29/78696* (2013.01); *H05B 33/02* (2013.01); *H05B 33/14* (2013.01); *G02F 1/1368* (2013.01); *G02F 1/136286* (2013.01); *G02F 1/15* (2013.01)

(58) Field of Classification Search
USPC .......................................... 257/72
See application file for complete search history.

(56) References Cited

U.S. PATENT DOCUMENTS

| | | | |
|---|---|---|---|
| 2011/0315980 | A1* | 12/2011 | Kim ................... H01L 29/7869 257/43 |
| 2013/0256653 | A1 | 10/2013 | Ahn et al. |
| 2015/0001531 | A1 | 1/2015 | Ueda et al. |
| 2015/0144942 | A1 | 5/2015 | Yang et al. |
| 2016/0190329 | A1 | 6/2016 | Matsumoto et al. |

FOREIGN PATENT DOCUMENTS

| | | |
|---|---|---|
| JP | 2011-124360 A | 6/2011 |
| JP | 2012-059860 | 3/2012 |
| JP | 2013-207100 | 10/2013 |
| JP | 2013-225551 | 10/2013 |
| JP | 2015-029053 | 2/2015 |
| JP | 2015-037164 | 2/2015 |
| JP | 2015-046568 | 3/2015 |
| KR | 10-2013-0101750 A | 9/2013 |
| RU | 2 371 809 C1 | 10/2009 |
| WO | WO 2014/109827 A1 | 7/2014 |

OTHER PUBLICATIONS

Office Action dated Jul. 2, 2019 in Japanese Patent Application No. 2018-506017.
Japanese Office Action dated Dec. 17, 2019 in Patent Application No. 2018-506017, citing documents AO and AP therein, 6 pages.
International Search Report dated Jun. 6, 2017 for counterpart International Patent Application No. PCT/JP2017/010747 filed Mar. 16, 2017 (with English Translation).
Written Opinion dated Jun. 6, 2017 for counterpart International Patent Application No. PCT/JP2017/010747 filed Mar. 16, 2017.
K. Nomura, five others, "Room-temperature fabrication of transparent flexible thin-film transistors using amorphous oxide semiconductors", Nature, vol. 432, Nov. 25, 2004, pp. 488-492.
Lin, et al., "High Electron Mobility Thin-Film Transistors Based on Solution-Processed Semiconducting Metal Oxide Heterojunctions and Quasi-Superlattices", Advanced Science, 2015, vol. 2,1500058, 12 pages.
Office Action dated Feb. 7, 2020 in Korean Patent Application No. 10-2018-7029916 filed Oct. 16, 2018 with English translation, 18 pages.

* cited by examiner

FIELD-EFFECT TRANSISTOR, DISPLAY ELEMENT, IMAGE DISPLAY DEVICE, AND SYSTEM

CROSS-REFERENCE TO RELATED APPLICATIONS

The present application is a continuation application of International Application No. PCT/JP2017/010747, filed Mar. 16, 2017, which claims priority to Japanese Patent Application No. 2016-055571, filed Mar. 18, 2016 and Japanese Patent Application No. 2016-157920, filed Aug. 10, 2016. The contents of these applications are incorporated herein by reference in their entirety.

BACKGROUND OF THE INVENTION

Field of the Invention

The present disclosure relates to a field-effect transistor, a display element, an image display device, and a system.

Description of the Related Art

Thin film transistors (TFT) have mainly been used for active matrix backplanes configured to drive liquid crystal displays and organic EL displays, for example. Amorphous silicone (a-Si) and low-temperature poly silicon (LTPS) have been used for their semiconductor active layer for a long time.

In recent years, TFTs including $InGaZnO_4$ (IGZO) oxide semiconductors, which exhibit more excellent mobility than a-Si, have vigorously been researched and developed in order to realize practical application (see, for example, Japanese Patent No. 4164562 and K. Nomura, five others, "Room-temperature fabrication of transparent flexible thin-film transistors using amorphous oxide semiconductors", NATURE, VOL 432, No. 25, NOVEMBER, 2004, pp. 488-492).

SUMMARY OF THE INVENTION

According to one aspect of the present disclosure, a field-effect transistor of the present disclosure includes: a gate electrode, which is configured to apply gate voltage; a source electrode and a drain electrode, which are configured to transfer an electrical signal; an active layer, which is formed between the source electrode and the drain electrode; and a gate insulating layer, which is formed between the gate electrode and the active layer.

The active layer includes at least two kinds of oxide layers including layer A and layer B.

The active layer satisfies at least one of condition (1) and condition (2) below:

condition (1): the active layer includes 3 or more oxide layers including 2 or more of the layer A; and condition (2): a band-gap of the layer A is lower than a band-gap of the layer B and an oxygen affinity of the layer A is equal to or higher than an oxygen affinity of the layer B.

DESCRIPTION OF THE EMBODIMENTS

Figure 1:
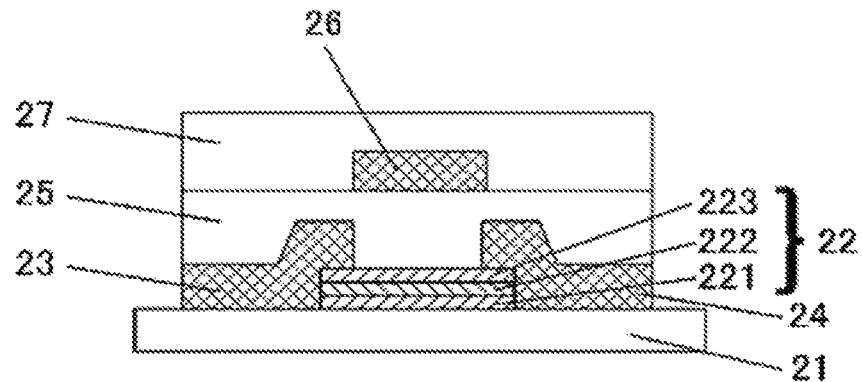
FIG. 1 is a schematic structural view illustrating one example of a field-effect transistor including a stacked active layer of the present disclosure.

The present disclosure has an object to provide a novel field-effect transistor including an oxide semiconductor active layer and having high mobility and low off-current.

According to the present disclosure, it is possible to provide a novel field-effect transistor including an oxide semiconductor active layer and having high mobility and low off-current.

(Field-Effect Transistor)

A field-effect transistor of the present disclosure includes a gate electrode, which is configured to apply gate voltage, a source electrode and a drain electrode, which are configured to transfer a signal, an active layer, which is formed between the source electrode and the drain electrode, and a gate insulating layer, which is formed between the gate electrode and the active layer, and further includes other members such as a passivation layer according to the necessity.

Because IGZO-TFTs generally have a mobility of about 10 $cm^2/Vs$, they have been limited to only application to pixel circuits of displays. Measures to improve mobility generally result in deterioration of TFT properties such as depletion shift, an increase in the off-current, and deterioration in bias stress property.

The present disclosure solves the aforementioned problems and has an object to achieve the following object. That is, the present disclosure has an object to provide a novel field-effect transistor including an oxide semiconductor active layer and having high mobility and low off-current, a display element, a display device, and a system.

<Active Layer>

The active layer includes at least two kinds of oxide layers including layer A and layer B.

The active layer satisfies at least one of condition (1) and condition (2) below.

<<Condition (1)>>

The active layer includes 3 or more oxide layers including 2 or more of the layer A.

<<<Layer A>>>

The layer A is an oxide semiconductor including, for example, zinc, cadmium, gallium, indium, thallium, tin, lead, bismuth, titanium, niobium, tantalum, molybdenum, and tungsten. The carrier concentration NA of the layer A is from about $10^{19}$ cm$^{-3}$ through about $10^{19}$ cm$^{-3}$. In the case of n-type, the Fermi level is located immediately below the conduction band. In the case of p-type, the Fermi level is located immediately above the balance band.

<<<Layer B>>>

On the other hand, the layer B is an oxide layer including, for example, a Group 2A element, a Group 3A element, zirconium, hafnium, boron, aluminium, silicon, germanium, and phosphorus. A carrier concentration of the layer B is less than $10^{16}$ cm$^{-3}$, which is semiconductive to insulative. The Fermi level of the layer B is closer to a center of the bandgap than the Fermi level of the layer A.

Here, the layer A is preferably an oxide layer including a Group A element, which is at least one selected from the group consisting of zinc, cadmium, gallium, indium, thallium, tin, lead, bismuth, titanium, niobium, tantalum, molybdenum, and tungsten. In that case, the layer B is more preferably free of the Group A element.

Moreover, the layer B is preferably an oxide layer including a Group B element, which is at least one selected from the group consisting of a Group 2A element, a Group 3A element, zirconium, hafnium, boron, aluminium, silicon, germanium, phosphorus, antimony, and tellurium. In that case, the layer A is more preferably free of the Group B element.

In a state where the layer A is electrically connected to the layer B, in the case of n-type, the bottom of the conduction band of the layer B is higher than the bottom of the conduction band of the layer A, and in the case of p-type, the top of the valence band of the layer B is lower than the top of the valence band of the layer A. As a result, the layer B functions as a blocking layer. Therefore, electrons or holes are confined within the layer A, realizing high mobility.

The active layer includes 3 or more oxide layers including 2 or more of the layer A. That is, a minimum layer configuration is a stacked structure: ABA. When the active layer includes a plurality of layers A, the plurality of layers A are preferably made of the same material. On the other hand, when the active layer includes a plurality of layers B, the layers B may be made of different materials. Examples of the stacked structure including the plurality of layers B include stacked structures such as ABAB'A.

In the active layer, at least one of the 2 or more of the layer A is in contact with the source electrode and the drain electrode.

Moreover, in the active layer, at least one of the 2 or more of the layer A is in contact with the gate insulating layer.

When the active layer is an ABA stacked structure of three layers that are the layer A, the layer B, and the layer A stacked in this order, it is preferable that one of the layers A be in contact with the gate insulating layer and the other of the layers A be in contact with the source electrode and the drain electrode. In this case, bandgap of the gate insulating layer is preferably larger than that of the active layer. As a result, electrons or holes of the layer A can be confined between the layer B and the gate insulating layer.

A crystal structure of IGZO, which has been studied in the past years, is a homologous structure and is a multilayered structure obtained by alternately stacking a layer of $InO_2$ and a layer of $(Zn, Ga)O_2$. In this case, the bottom of the conduction band is formed of the 5s orbital of In, the 4s orbital of Zn, and the 4s orbital of Ga. Therefore, although the crystal structure is a multilayered structure, electrons are not two-dimensionally distributed. Similarly, when oxides of indium, zinc, and gallium are artificially stacked, the two-dimensional property is weak. Moreover, even if due to weak effect of blocking, an increase in the number of the layers results in an increase in the off-current and a slight increase in mobility to increase the on-current, the on/off ratio does not increase [see, for example, non-patent literature (Y.-H. Lin, 12 others "High electron mobility thin-film transistors based on solution-processed semiconducting metal oxide heterojunctions and quasi-superlattices", Advanced Science VOL 2 ISSUE 7, JULY 2015, p. 1500058)]. On the other hand, in cases where the field-effect transistor satisfies the condition (1) of the present disclosure, in particular, an oxide layer having low carrier concentration and being capable of providing a wide energy gap between the layer A and the layer B is chosen as the layer B, realizing higher two-dimensional property, higher mobility, and low off-current. The most preferable combination of the layer A and the layer B is an oxide solid solution including the same Bravais lattices. Specific examples of the combination are presented below.

<1> Layer A: $MgIn_2O_4$ (spinel structure)/layer B: $MgAl_2O_4$ (spinel structure)

<2> Layer A: $In_2O_s$ (bixbite structure)/layer B: $(Y, La)_2O_3$ (bixbite structure)

<3> Layer A: $SnO_2$ (rutile structure)/layer B: $MgSb_2O_6$/rutile (trirutile structure)

<4> Layer A: CdO (NaCl structure)/layer B: $(Zr, Hf)O_2$ (fluorite structure)

<5> Layer A: ZnO (wurtzite structure)/layer B: $Al_2O_3$ (corundum structure)

An oxide semiconductor of the layer A has the following properties compared to an oxide semiconductor of the layer B.

<i> The electric conductivity σA of the layer A is higher than the electric conductivity σB of the layer B.

<ii> The carrier concentration NA of the layer A is higher than the carrier concentration NB of the layer B.

<iii> The activation energy ΔEA of electric conduction of the layer A is lower than the activation energy ΔEB of electric conduction of the layer B.

<iv> The bandgap EAg of the layer A is lower than the bandgap EBg of the layer B.

When any one of the aforementioned <i> to <iv> is satisfied, at least one of the layer A is preferably in contact with the source electrode and the drain electrode.

A thickness of each layer is, for example, several nanometers to about 20 nm or less, more preferably several nanometers to about 10 nm.

<<Condition (2)>>

A band-gap of the layer A is lower than a band-gap of the layer B.

An oxygen affinity of the layer A is equal to or higher than an oxygen affinity of the layer B.

A difference (EBg–EAg) between the band-gap [EBg (eV)] of the layer B and the band-gap [EAg (eV)] of the layer A is not particularly limited and may be appropriately selected depending on the intended purpose. However, the difference is preferably 0.05 eV or more but 2 eV or less, more preferably 0.1 eV or more but 1.5 eV or less, in terms of quantum confinement.

In the present disclosure, the oxygen affinity is an indicator of difficulty in generation of oxygen vacancies in the active layer. As the indicator, the standard Gibbs energy of formation $\Delta G^0$ of the oxide can be used. In general, a value of the $\Delta G^0$ is a value in minus. It is said that the larger an absolute value of the $\Delta G^0$ is, the stronger the oxygen affinity is.

A difference ($\Delta GA^0-\Delta GB^0$) between the oxygen affinity [$\Delta GA^0$ (kcal/GFW (300 k))] of the layer A and the oxygen affinity [$\Delta GB^0$ (kcal/GFW (300 k))] of the layer B is not particularly limited and may be appropriately selected depending on the intended purpose. The difference is preferably 0 or less in terms of generation of carriers.

Here, the band-gap of the layer A and the band-gap of the layer B can be determined by an optical absorption spectrum.

Moreover, the oxygen affinity of the layer A and the oxygen affinity of the layer B can be simply calculated by the standard Gibbs energy of formation of the oxide.

<<<Layer A>>>

The layer A is an oxide semiconductor including, for example, zinc, cadmium, gallium, indium, thallium, tin, lead, bismuth, titanium, niobium, tantalum, molybdenum, and tungsten as A1 element.

The layer A is the oxide semiconductor further including, for example, magnesium, calcium, strontium, barium, scandium, yttrium, lanthanoids, zirconium, hafnium, aluminium, silicon, and germanium as A2 element.

The number of atoms NA1 of the A1 element is preferably larger than the number of atoms NA2 of the A2 element. For example, in the case of an n-type oxide semiconductor, the conduction band is mainly created from an orbital of the outermost shell of the A1 element, constituting the conduction band having high mobility. Although the oxide of the A1 element easily generates oxygen vacancies, addition of the A2 element makes it possible to prevent generation of oxygen vacancies.

Moreover, as a combination of the A1 element and the A2 element, a combination causing no substitutional doping is selected. As a result, when the layer A is a single layer, the resultant carrier concentration NA can be limited to, for example, less than $10^{16}$ cm$^{-3}$.

<<<Layer B>>>

On the other hand, the layer B is an oxide semiconductor including, for example, zinc, cadmium, gallium, indium, thallium, tin, lead, bismuth, titanium, niobium, tantalum, molybdenum, and tungsten as B1 element.

The layer B may further include, for example, magnesium, calcium, strontium, barium, scandium, yttrium, lanthanoids, zirconium, hafnium, aluminium, silicon, and germanium as B2 element.

The bandgap EBg of the layer B is larger than the bandgap EAg of the layer A. In the case of an n-type oxide semiconductor, each formulation is selected so that the bottom energy of the conduction band of the layer B is shallower than that of the layer A.

Therefore, depending on the combination of the A1 element and the B1 element, the above characteristics of the bandgap can be satisfied. However, incorporation of the A2 element and the B2 element makes it possible to increase options of formulation expanding the bandgap, preventing oxygen vacancies at the same time.

Moreover, the layer B may include B3 element for the purpose of substitutional doping. Examples of the B3 element include aluminium, gallium, indium, thallium, germanium, tin, lead, antimony, bismuth, titanium, niobium, tantalum, molybdenum, tungsten, rhenium, and osmium.

When the layer B is a single layer, the resultant carrier concentration NB is, for example, $10^{16}$ cm$^{-3}$ or more.

Here, a Group number of the B3 element in a periodic table is preferably larger than a Group number of the B1 element in the periodic table.

In general, in the case of an n-type oxide semiconductor, as the conduction band is shallower, it is difficult to generate oxygen vacancies, resulting in difficulty in generation of carriers attributed to the oxygen vacancies. For example, when $In_2O_3$ is selected as the layer A and $Ga_2O_3$ is selected as the layer B, it is easy for $In_2O_3$ to generate oxygen vacancies and it is difficult for $Ga_2O_3$ to generate oxygen vacancies. Before connection of the layer A with the layer B, the NA is larger than the NB, which is not preferable. When the field-effect transistor satisfies the condition (2) of the present disclosure, while the relationship of energy level between conduction band minimum (CBM) of the layer A and that of the layer B is maintained (EcA<EcB), the A2 element is added to the layer A (the B2 element is added to the layer B according to the necessity) to increase the oxygen affinity of the layer A. As a result, oxygen vacancies and generation of carriers attributed to the oxygen vacancies are prevented. In this case, "oxygen affinity" means difficulty in releasing a small amount of oxygen atoms from the oxide $M_xO_y$ ($M_xO_y$ to $M_xO_{y-\delta}+\delta O$). As an indicator of the oxygen affinity, the standard Gibbs energy of formation $\Delta G^0$ of the oxide can be used. For example, $In_2O_3$ (Eg=3.75 eV), $Ga_2O_3$ (Eg=4.52 eV (E//c), 4.79 eV (E//b)), and $ZnGa_2O_4$ (Eg=5.0 eV) can be simply estimated to be $\Delta G^0$ of −134.0 kcal/GFW (300 k), $\Delta G^0$ of −158.0 kcal/GFW (300 k), and $\Delta G^0$ of −157.8 kcal/GFW (300 k), respectively [see, for example, non-patent literature (Thomas B. Reed, Free Energy of Formation of Binary Compounds, MIT Press, Cambridge, Mass., 1971, D. R. Stull and H. Prophet, JANAF Thermochemical Tables, NSRDS-NBS 37, U.S. Dept of Commerce, National Bureau of Standards, 1971]. As described above, choice of a combination of $In_2O_3$/$Ga_2O_3$ as "layer A/layer B" is inappropriate because oxygen vacancies occur at a side of $In_2O_3$ having deep CBM. Meanwhile, when a combination of $Ga_2O_3$/$ZnGa_2O_4$ is chosen as "layer A/layer B", no oxygen vacancies occur at the layer A because each $\Delta G^0$ is substantially the same. Moreover, substitutional doping is performed by adding the B3 element to the layer B, which makes it possible to realize NA<NB.

Before connection of the layer A with the layer B, the carrier concentration NA of the layer A is preferably lower than the carrier concentration NB of the layer B. Moreover, after the connection of the layer A with the layer B, the carrier concentration NA of the layer A is preferably higher than the carrier concentration NB of the layer B.

Here, the carrier concentration can be measured through, for example, the Hall measurement.

In a state where the layer A is electrically connected to the layer B, carriers generated in the layer B are transferred to the layer A and the layer B functions as the blocking layer from the viewpoint of energy. As a result, the carriers are confined within the layer A, realizing high mobility.

When the active layer includes a plurality of layers A, the plurality of layers A are preferably made of the same material. On the other hand, when the active layer includes a plurality of layers B, the layers B may be made of different materials. Examples of the stacked structure including the plurality of layers B include stacked structures such as ABAB'A. Here, in the ABAB'A, B and B' each belong to the layer B, but are made of different materials.

A crystal structure of IGZO, which has been studied in the past years, is a homologous structure and is a multilayered structure obtained by alternately stacking a layer of $InO_2$ and a layer of (Zn, Ga)O$_2$. In this case, the bottom of the conduction band is formed of the 5s orbital of In, the 4s orbital of Zn, and the 4s orbital of Ga. Therefore, although the crystal structure is a multilayered structure, electrons are not two-dimensionally distributed. When oxides of indium, zinc, and gallium are artificially stacked, the two-dimensional property is weak. Moreover, even if due to weak effect of blocking, an increase in the number of the layers results in an increase in the off-current and a slight increase in mobility to increase the on-current, the on/off ratio does not increase. Moreover, a layer of In$_2$O$_3$, which has a conduction band having the deepest energy level, easily generates oxygen vacancies to perform generation of carriers in the conduction layer. Therefore, it means that many scattering sources of carriers exist from the beginning [see, for example, non-patent literature (Y.-H. Lin, 12 others, "High electron mobility thin-film transistors based on solution-processed semiconducting metal oxide heterojunctions and quasi-superlattices", Advanced Science VOL 2 ISSUE 7, JULY 2015, p. 1500058)]. On the other hand, in cases where the field-effect transistor satisfies the condition (2) of the present disclosure, while large energy difference between the layer A and the layer B is obtained, incorporation of the group of the A2 element to the layer A and carrier doping to the layer B are performed, which results in an increase in the two dimensional property. In addition, a carrier-confining layer (layer A) is separated from a carrier-generating layer (layer B), realizing high mobility and low off-current.

A thickness of each layer is, for example, several nanometers to about 20 nm or less, more preferably several nanometers to about 10 nm.

Preferable examples of the configurations of the TFTs include structures presented in FIGS. 1 to 5.

<Method for Producing Active Layer>

A method for producing the active layer of the present disclosure can be appropriately selected from, for example, vacuum processes of the film formation (e.g., sputtering method) and print processes of the film formation (e.g., slit coating). The method for producing the active layer is particularly preferably a print process including a step of coating the coating liquid for forming oxide semiconductor and a heat treatment step.

Coating Liquid for Forming Oxide Semiconductor Film

The coating liquid for forming oxide semiconductor film is preferably obtained by dissolving, in a solvent, a metal element constituting an oxide semiconductor as an oxide, an inorganic salt, a carboxylate, an organic compound, or an organometallic. The oxide, the inorganic salt, the carboxylate, the organic compound, or the organometallic may homogeneously be dissolved in the solvent and may be dissociated to form ions. When the oxide, the inorganic salt, the carboxylate, the organic compound, or the organometallic is dissolved in the coating liquid for forming oxide semiconductor film, segregation of the concentration in the coating liquid for forming oxide semiconductor film hardly occurs. Therefore, the coating liquid for forming oxide semiconductor film can be used for a long time. Moreover, a thin film prepared using this coating liquid also has a uniform formulation. Therefore, when the coating liquid is used in the active layer of the field-effect transistor, uniformity of properties is favorable.

Hereinafter, the above compounds will individually be described.

<<Indium-Including Compound>>

As one example, a case where the aforementioned metal is indium (In) will be described.

The indium-including compound is not particularly limited and may be appropriately selected depending on the intended purpose. Examples of the indium-including compound include organic indium compounds and inorganic indium compounds.

Organic Indium Compounds

The organic indium compounds are not particularly limited and may be appropriately selected depending on the intended purpose, so long as the organic indium compounds are compounds including indium and an organic group. The indium and the organic group are bound via, for example, an ionic bond, a covalent bond, or a coordination bond.

The organic group is not particularly limited and may be appropriately selected depending on the intended purpose. Examples of the organic group include alkoxy groups that may have substituents, acyloxy groups that may have substituents, and acetylacetonato groups that may have substituents.

Examples of the alkoxy groups include alkoxy groups including 1 through 6 carbon atoms.

Examples of the acyloxy groups include acyloxy groups including 1 through 10 carbon atoms.

Examples of the substituents include halogen and a tetrahydrofuryl group.

Examples of the organic indium compounds include triethoxy indium, indium 2-ethylhexanoate, and indium acetylacetonato.

Inorganic Indium Compounds

The inorganic indium compounds are not particularly limited and may be appropriately selected depending on the intended purpose. Examples of the inorganic indium compounds include indium oxoacids, indium halides, indium hydroxides, and indium cyanides.

Examples of the indium oxoacids include indium nitrates, indium sulfates, and indium carbonates.

Examples of the indium halides include indium fluorides, indium chlorides, indium bromides, and indium iodides.

Among them, indium oxoacids and indium halides are preferable, indium nitrates and indium chlorides are more preferable, in terms of high solubility in various solvents.

The indium nitrates are not particularly limited and may be appropriately selected depending on the intended purpose. Examples of the indium nitrates include indium nitrate hydrates. Examples of the indium nitrate hydrates include indium nitrate trihydrate and indium nitrate pentahydrate.

The indium sulfates are not particularly limited and may be appropriately selected depending on the intended purpose. Examples of the indium sulfates include anhydrous indium sulfates and indium sulfate hydrates. Examples of the indium sulfate hydrates include indium sulfate nonahydrate.

The indium chlorides are not particularly limited and may be appropriately selected depending on the intended purpose. Examples of the indium chlorides include indium chloride hydrates. Examples of the indium chloride hydrates include indium chloride tetrahydrate.

These indium-including compounds may be synthesized or may be commercially available products.

Coating Step

The coating step is not particularly limited and may be appropriately selected depending on the intended purpose, so long as the coating step is a step of coating a coating liquid for forming oxide semiconductor.

The coating method is not particularly limited and may be appropriately selected depending on the intended purpose. As the coating method, existing methods (e.g., spin coating, inkjet printing, slit coating, nozzle printing, gravure printing, and microcontact printing) can be used. Among them, when a film having a large area and a uniform thickness is produced in a simple manner, spin coating and slit coating are preferable. Moreover, when an appropriate printing method (e.g., inkjet printing and microcontact printing) and an appropriate printing condition are used, it is possible to print a matter having a desirable shape. Therefore, it is unnecessary to perform patterning in the post-process.

Heat Treatment Step

The heat treatment step is not particularly limited and may be appropriately selected depending on the intended purpose, so long as the heat treatment step is a step of performing heat treatment after the coating step and is a step capable of drying the solvent in the coating liquid for forming oxide semiconductor; decomposing included compounds; and producing the oxide semiconductor.

In the heat treatment step, drying of the solvent (hereinafter referred to as "drying treatment"), and decomposition of the included compound and generation of the oxide semiconductor (hereinafter referred to as "decomposition and generation treatment") are preferably performed at different temperatures. Specifically, it is preferable that after the drying of the solvent, the temperature be elevated to decompose the included compound and generate the oxide semiconductor.

A temperature of the drying treatment is not particularly limited and may be appropriately selected depending on the solvent contained. For example, the temperature of the drying treatment is from 80° C. through 180° C. As for the drying, it is also effective to use a vacuum oven in order to lower the temperature.

A time of the drying treatment is not particularly limited and may be appropriately selected depending on the intended purpose. For example, the time of the drying treatment is from 1 minute through 1 hour.

A temperature of the decomposition and generation treatment is not particularly limited and may be appropriately selected depending on the intended purpose. The temperature of the decomposition and generation treatment is from 200° C. through 400° C., for example.

A time of the decomposition and generation treatment is not particularly limited and may be appropriately selected depending on the intended purpose. The time of the decomposition and generation treatment is from 10 minutes through 5 hours, for example.

When the TFT of the present disclosure includes the active layer including 3 or more layers, the 3 or more layers are desirably collectively treated at one time in the final decomposition and generation treatment. Moreover, the gate insulating film and the passivation layer, which are disposed at the top of the active layer or the bottom of the active layer and form interfaces with the active layer, and the active layer are desirably collectively treated at one time in the final decomposition and generation treatment. This treatment makes it possible to form a smooth interface between the active layer and the gate insulating film and a smooth interface between the active layer and the passivation layer as well as an interface between the layer A and the layer B in the active layer. That is, a favorable front channel and a favorable back channel can be produced.

A method of the heat treatment step is not particularly limited and may be appropriately selected depending on the intended purpose. Examples of the method of the heat treatment step include a method of heating a support member.

An atmosphere in the heat treatment step is not particularly limited and may be appropriately selected depending on the intended purpose, but the atmosphere is preferably an oxygen atmosphere. When the heat treatment is performed in the oxygen atmosphere, decomposed products can be promptly discharged to the outside of the system, and oxygen vacancies of the resultant oxide semiconductor can be reduced.

In the heat treatment step, in order to accelerate reaction in the decomposition and generation treatment, it is effective to irradiate, with ultraviolet rays having a wavelength of 400 nm or shorter, the coating liquid that has undergone the drying treatment. Emitting the ultraviolet rays having a wavelength of 400 nm or shorter cleaves chemical bonds of the organic materials contained in the coating liquid and decomposes the organic materials. Therefore, the oxide semiconductor can be efficiently produced.

The ultraviolet rays having a wavelength of 400 nm or shorter are not particularly limited and may be appropriately selected depending on the intended purpose. Examples of the ultraviolet rays include ultraviolet rays having a wavelength of 222 nm using an excimer lamp.

Applying ozone in place of or in combination with irradiation of the ultraviolet rays is also preferable. Applying the ozone to the coating liquid, which has undergone the drying treatment, accelerates generation of the oxide.

In the method for producing the oxide semiconductor of the present disclosure, the oxide semiconductor is produced through a coating process, which makes it possible to easily produce a large amount of the inexpensive oxide semiconductors compared to those produced through a vacuum process.

<Gate Electrode>

The gate electrode is not particularly limited and may be appropriately selected depending on the intended purpose so long as the gate electrode is configured to apply gate voltage.

A material of the gate electrode is not particularly limited and may be appropriately selected depending on the intended purpose. Examples of the material include: metals (e.g., Mo, Al, Au, Ag, and Cu) and alloys of these metals; multilayered metal films (e.g., Mo/Al/Mo, Ti/Al/Ti, Mo/Cu/Mo, and Ti/Cu/Ti); transparent conductive oxides (e.g., indium thin oxide (ITO) and antimony-doped tin oxide (ATO)); and organic conductors (e.g., polyethylene dioxythiophene (PEDOT) and polyaniline (PANT)).

A formation method of the gate electrode is not particularly limited and may be appropriately selected depending on the intended purpose. Examples of the formation method include: (i) a method of forming a film through a sputtering method or a dip coating method to pattern the film through photolithography; and (ii) a method of directly forming a film having a desired shape through a printing process such as inkjet printing, nanoimprinting, or gravure printing.

An average thickness of the gate electrode is not particularly limited and may be appropriately selected depending on the intended purpose, but the average thickness of the gate electrode is preferably from 20 nm through 1 µm, more preferably from 50 nm through 500 nm.

<Source Electrode and Drain Electrode>

The source electrode and the drain electrode are not particularly limited and may be appropriately selected depending on the intended purpose, so long as the source electrode and the drain electrode are electrodes configured to transfer an electrical signal between the electrodes.

A material of the source electrode and a material of the drain electrode are not particularly limited and may be appropriately selected depending on the intended purpose. Examples of these materials include the same materials as the materials described for the gate electrode.

Large contact resistance between the active layer and the source electrode and contact resistance between the active layer and the drain electrode results in deterioration of characteristics of the transistor. In order to prevent the aforementioned problem, the material of the source electrode and the material of the drain electrode are preferably selected from materials that make it possible to reduce contact resistance.

The source electrode and the drain electrode are preferably in contact with at least the layer A of the active layer. Moreover, the layer B of the active layer may be in contact with the source electrode and the drain electrode.

A method for producing the source electrode and a method for producing the drain electrode are not particularly limited and may be appropriately selected depending on the intended purpose. Examples of these methods include the same methods as the methods described for the gate electrode.

An average thickness of the source electrode and an average thickness of the drain electrode are not particularly limited and may be appropriately selected depending on the intended purpose, but these thicknesses are preferably from 20 nm through 1 µm, more preferably from 50 nm through 500 nm.

<Gate Insulating Layer>

The gate insulating layer is not particularly limited and may be appropriately selected depending on the intended purpose, so long as the gate insulating layer is an insulating layer formed between the gate electrode and the active layer.

A material of the gate insulating layer is not particularly limited and may be appropriately selected depending on the intended purpose. Examples of the material include materials that have already been used for mass production (e.g., $SiO_2$ and SiNx), materials having high permittivity (e.g., $La_2O_3$ and $HfO_2$), and organic materials (polyimide (PI) and fluororesins).

A method for forming the gate insulating layer is not particularly limited and may be appropriately selected depending on the intended purpose. Examples of the method include the vacuum methods of the film formation (e.g., sputtering, chemical vapor deposition (CVD), and atomic layer deposition (ALD)) and the print methods (e.g., spin coating, slit coating, and inkjet printing).

The gate insulating layer having high permittivity is more preferably formed as described below. Specifically, on the active layer that has been formed through the method for producing the active layer, a coating liquid for material having high permittivity is coated in the same manner as described in the method for producing the active layer and is subjected to the evaporation treatment. Then, the resultant and the active layer are collectively subjected to the final decomposition and generation treatment at one time to form a gate insulating layer having high permittivity. As a result, considerably favorable interface between the active layer and the gate insulating layer can be formed.

An average thickness of the gate insulating layer is not particularly limited and may be appropriately selected depending on the intended purpose, but the average thickness of the gate insulating layer is preferably from 30 nm through 500 nm, more preferably from 50 nm through 300 nm.

One example of configuration of the field-effect transistor is presented in FIG. 1. In FIG. 1, an active layer 22 has a multilayered structure obtained by stacking 3 layers: a layer A 221, a layer B 222, and a layer A 223.

Figure 5:
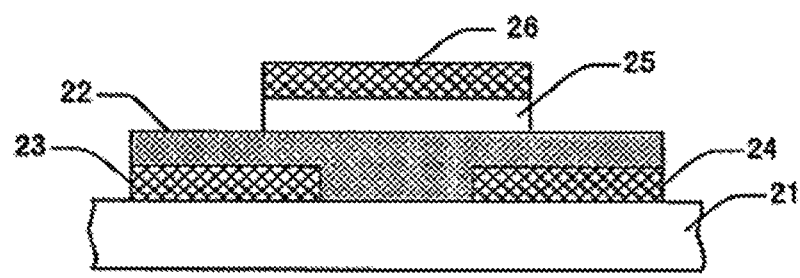
FIG. 5 is a schematic structural view illustrating one example of a bottom contact/top gate field-effect transistor.

A structure of the field-effect transistor is not particularly limited and may be appropriately selected depending on the intended purpose. Examples of the structure of the field-effect transistor include a top contact/bottom gate field-effect transistor (FIG. 2), a bottom contact/bottom gate field-effect transistor (FIG. 3), a top contact/top gate field-effect transistor (FIG. 4), and a bottom contact/top gate field-effect transistor (FIG. 5). A top contact/top gate field-effect transistor and a bottom contact/top gate field-effect transistor are particularly preferable.

In FIGS. 1 to 5, reference numeral 21 denotes a substrate, reference numeral 22 denotes an active layer, reference numeral 23 denotes a source electrode, reference numeral 24 denotes a drain electrode, reference numeral 25 denotes a gate insulating layer, reference numeral 26 denotes a gate electrode, and reference numeral 27 denotes a passivation layer.

The field-effect transistor can suitably be used for display elements described below, but use of the field-effect transistor is not limited to the display elements. For example, the field-effect transistor can be used for IC cards, ID tags, and other electronic circuits.

The field-effect transistor includes the stacked oxide semiconductor of the present disclosure in the active layer. Therefore, the active layer can achieve preferable properties by adjusting formulation, resulting in favorable transistor characteristics.

(Display Element)

A display element of the present disclosure includes at least a light control element and a driving circuit configured to drive the light control element. The display element further includes other members according to the necessity.

<Light Control Element>

The light control element is not particularly limited and may be appropriately selected depending on the intended purpose, so long as the light control element is an element configured to control a light output according to a driving signal. The light control element preferably includes an organic electroluminescent (EL) element, an electrochromic (EC) element, a liquid crystal element, an electrophoretic element, or an electrowetting element.

<Driving Circuit>

The driving circuit is not particularly limited and may be appropriately selected depending on the intended purpose, so long as the driving circuit includes the semiconductor element of the present disclosure.

<Other Members>

The other members are not particularly limited and may be appropriately selected depending on the intended purpose.

The display element of the present disclosure includes the semiconductor element (for example, the field-effect transistor). Therefore, unevenness between elements is small. Moreover, even when the display element changes over time, the driving transistor can be driven at constant gate voltage, resulting in long lifetime of the elements.

(Image Display Device)

An image display device of the present disclosure includes at least a plurality of display elements, a plurality of wired lines, and a display control device. The image display device further includes other members according to the necessity.

<Display Element>

The display element is not particularly limited and may be appropriately selected depending on the intended purpose, so long as the display element is the display element of the present disclosure arranged in a form of matrix.

<Wired Line>

The wired line is not particularly limited and may be appropriately selected depending on the intended purpose, so long as the wired line is a wired line configured to individually apply gate voltage and image data signal to the field-effect transistor in the display element.

<Display Control Device>

The display control device is not particularly limited and may be appropriately selected depending on the intended purpose, so long as the display control device is a device configured to individually control the gate voltage and the signal voltage of the field-effect transistors via a plurality of the wired lines correspondingly to the image data.

<Other Components>

The other components are not particularly limited and may be appropriately selected depending on the intended purpose.

An image display device of the present disclosure includes the display element of the present disclosure. Therefore, the image display device has long lifetime and is stably driven.

The image display device of the present disclosure can be used as a display unit in mobile information devices (e.g., mobile phones, portable music players, portable video players, electronic books, and personal digital assistants (PDAs)) and camera devices (e.g., still cameras and video cameras). The image display device can also be used for display units of various pieces of information in transportation systems (e.g., cars, aircraft, trains, and ships). Furthermore, the image display device can be used for display units of various pieces of information in measuring devices, analysis devices, medical equipment, and advertising media.

(System)

A system of the present disclosure includes at least the image display device of the present disclosure and an image-data-generating device.

The image-data-generating device is configured to generate image data based on image information to be displayed and to output the image data to the image display device.

Because the system of the present disclosure includes the image display device of the present disclosure, image information with high definition can be displayed.

The image display device of the present disclosure will next be described hereinafter.

Figure 2:
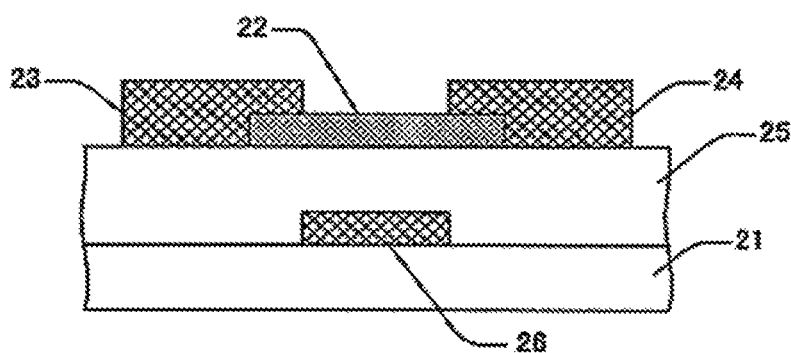
FIG. 2 is a schematic structural view illustrating one example of a top contact/bottom gate field-effect transistor.
Figure 3:
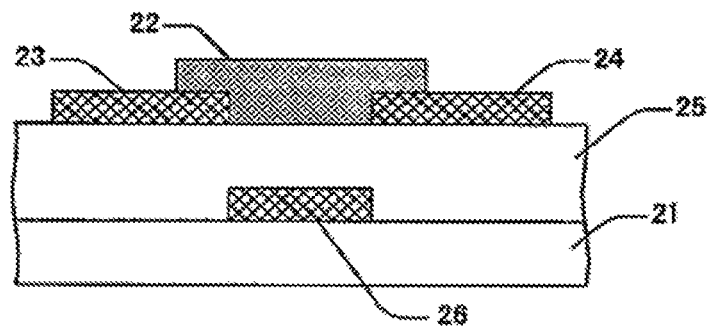
FIG. 3 is a schematic structural view illustrating one example of a bottom contact/bottom gate field-effect transistor.
Figure 4:
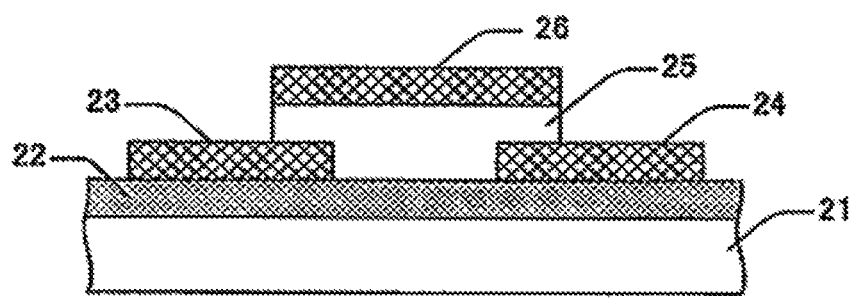
FIG. 4 is a schematic structural view illustrating one example of a top contact/top gate field-effect transistor.

The image display device of the present disclosure can be obtained by employing configurations described in paragraphs [0059] to [0060] and FIGS. 2 and 3 of Japanese Unexamined Patent Application Publication No. 2010-074148.

One example of the embodiment of the present disclosure will next be described with reference to the figures.

Figure 6:
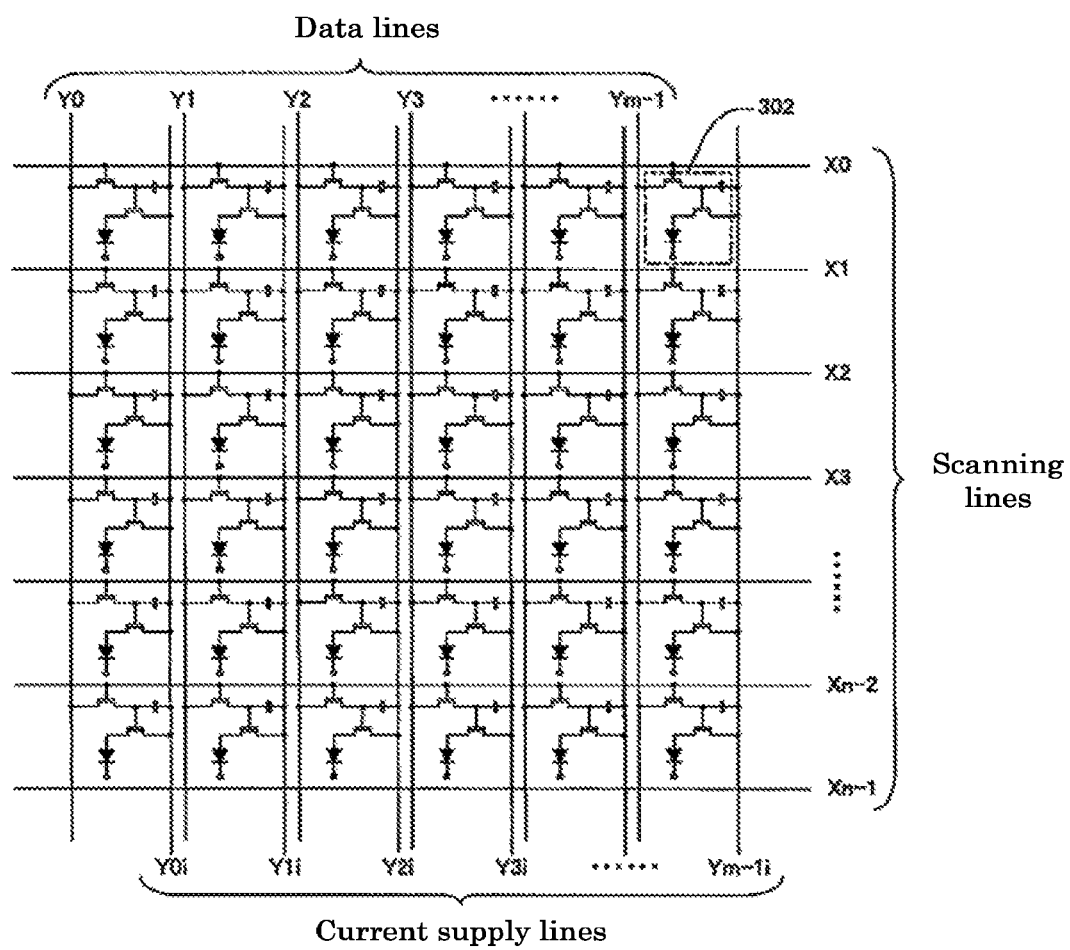
FIG. 6 is a diagram for presenting an image display device.

FIG. 6 is a diagram for presenting a display in which display elements are arranged in a form of matrix. As illustrated in FIG. 6, the display includes "n" scanning lines (X0, X1, X2, X3, ... Xn−2, Xn−1) arranged along the X axis direction at constant intervals, "m" data lines (Y0, Y1, Y2, Y3, ... Ym−1) arranged along the Y axis direction at constant intervals, and "m" current supply lines (Y0i, Y1i, Y2i, Y3i, ... Ym−1i) arranged along the Y axis direction at constant intervals. Here, meanings of reference numerals (for example, X1 and Y1) are in common throughout FIGS. 7, 11, 12, and 13.

Therefore, the display element 302 can be identified by the scanning lines and the data lines.

Figure 7:
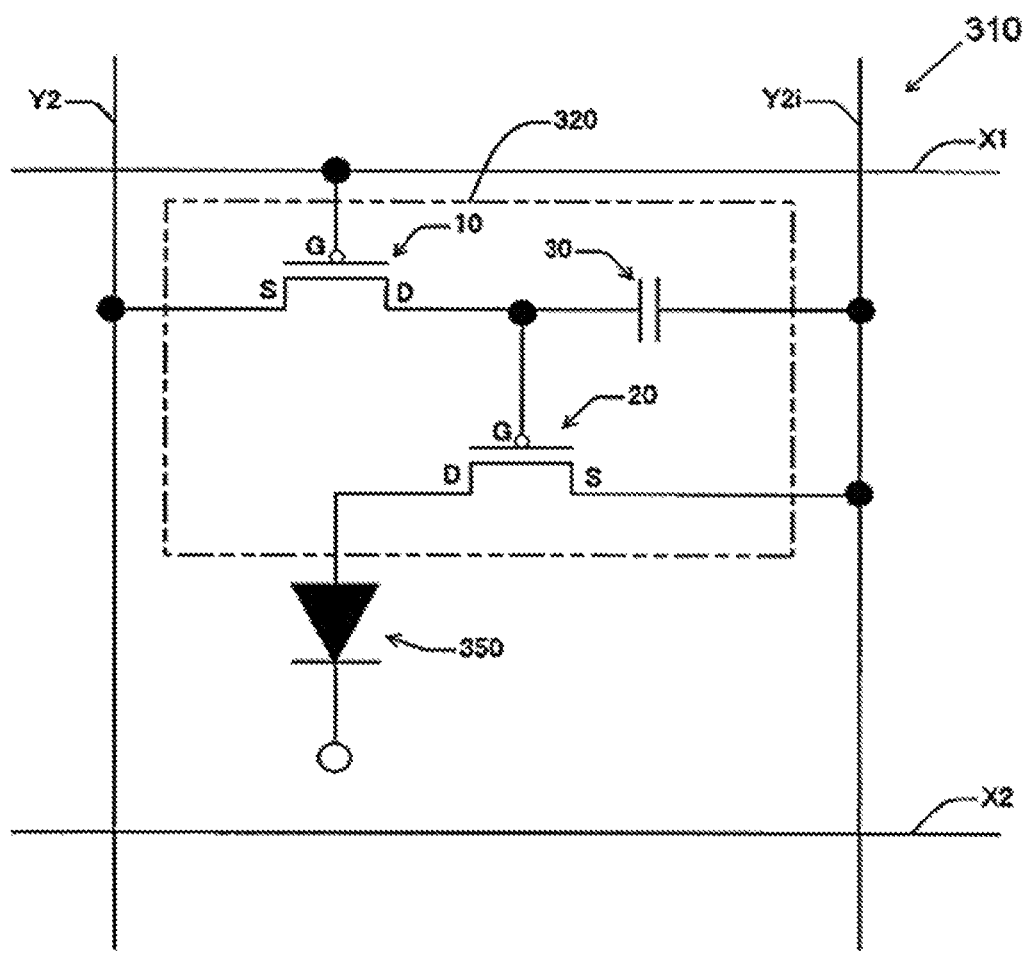
FIG. 7 is a diagram for presenting one example of a display element of the present disclosure.

FIG. 7 is a schematic structural view illustrating one example of the display element of the present disclosure.

As illustrated as one example in FIG. 7, the display element includes an organic electroluminescent (EL) element 350 and a drive circuit 320 configured to allow the organic EL element 350 to emit light. That is, a display 310 is an organic EL display of a so-called active matrix system. Moreover, the display 310 is a 32-inch display adaptable to colors. A size of the display 310 is not limited to 32 inches.

The drive circuit 320 in FIG. 7 will be described.

The drive circuit 320 includes two field-effect transistors 10 and 20 and a capacitor 30.

The field-effect transistor 10 serves as a switching element. A gate electrode G of the field-effect transistor 10 is coupled to a predetermined scanning line and a source electrode S of the field-effect transistor 10 is coupled to a predetermined data line. Moreover, a drain electrode D of the field-effect transistor 10 is coupled to one terminal of the capacitor 30.

The field-effect transistor 20 is configured to supply electric current to the organic EL element 350. The gate electrode G of the field-effect transistor 20 is coupled to the drain electrode D of the field-effect transistor 10. The drain electrode D of the field-effect transistor 20 is coupled to the anode of the organic EL element 350 and a source electrode S of the field-effect transistor 20 is coupled to a predetermined current supply line.

The capacitor 30 is configured to memorize the state of the field-effect transistor 10; i.e., data. The other terminal of the capacitor 30 is coupled to a predetermined current supply line.

When the field-effect transistor 10 turns into the state of "on", image data are stored in the capacitor 30 via the signal line Y2. Even after turning the field-effect transistor 10 into the state of "off", the organic EL element 350 is driven by maintaining the "on" state of the field-effect transistor 20 corresponding to the image data.

Figure 8:
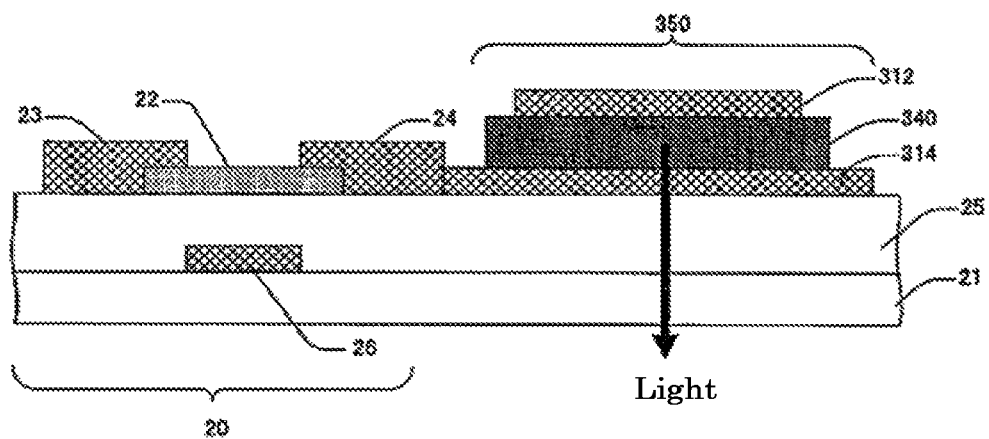
FIG. 8 is a schematic structural view illustrating one example of a positional relationship between an organic EL element and a field-effect transistor in a display element.

FIG. 8 presents one example of a positional relationship between an organic EL element 350 and a field-effect transistor 20 serving as a drive circuit in a display element. Here, the organic EL element 350 is disposed next to the field-effect transistor 20. Note that, a field-effect transistor and a capacitor (not illustrated) are also formed on the same substrate.

A passivation film is suitably disposed on or above the active layer 22, although the passivation film is not illustrated in FIG. 8. A material of the passivation film may be appropriately selected from $SiO_2$, SiNx, $Al_2O_3$, and fluoropolymers.

Figure 9:
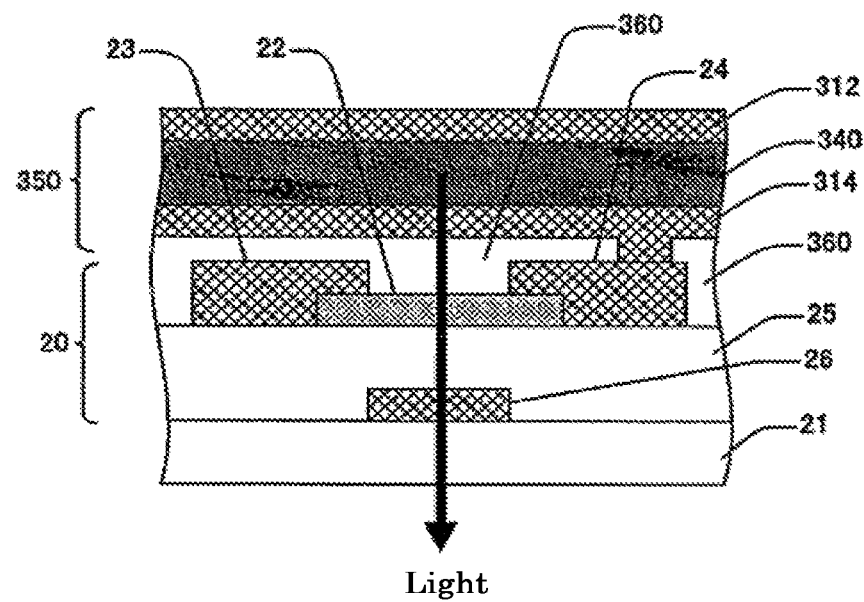
FIG. 9 is a schematic structural view illustrating another example of a positional relationship between an organic EL element and a field-effect transistor in a display element.

As illustrated in FIG. 9, for example, the organic EL element 350 may be disposed on the field-effect transistor 20. In the case of this structure, the gate electrode 26 is required to have transparency. Therefore, a conductive transparent oxide (e.g., ITO, $In_2O_3$, $SnO_2$, ZnO, Ga-added ZnO, Ad-added ZnO, and Sb-added $SnO_2$) is used for the gate electrode 26. Note that, reference numeral 360 is an interlayer insulating film (a leveling film). Polyimide or acrylic resins can be used for the insulating film.

In FIGS. 8 and 9, the field-effect transistor 20 includes a substrate 21, an active layer 22, a source electrode 23, a drain electrode 24, a gate insulating layer 25, and a gate electrode 26. An organic EL element 350 includes a cathode 312, an anode 314, and an organic EL thin film layer 340.

Figure 10:
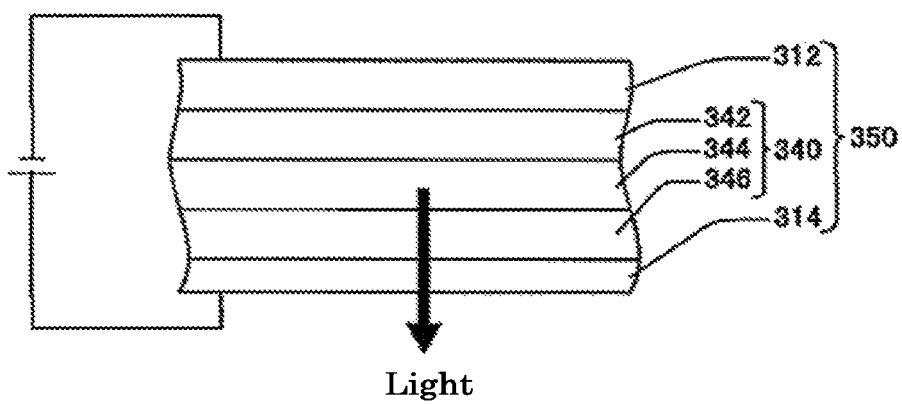
FIG. 10 is a schematic structural view illustrating one example of an organic EL element.

FIG. 10 is a schematic structural view illustrating one example of an organic EL element.

In FIG. 10, an organic EL element 350 includes a cathode 312, an anode 314, and an organic EL thin film layer 340.

A material of the cathode 312 is not particularly limited and may be appropriately selected depending on the intended purpose. Examples of the material include aluminium (Al), magnesium (MO-silver (Ag) alloy, aluminium (Al)-lithium (Li) alloy, and indium tin oxide (ITO). Note that, the magnesium (Mg)-silver (Ag) alloy becomes a high-reflective electrode if having a sufficient thickness, and an extremely thin film (less than about 20 nm) of the Mg—Ag alloy becomes a semi-transparent electrode. In the figure, light is taken out from the side of the anode. However, light can be taken out from the side of the cathode when the cathode is a transparent electrode or a semi-transparent electrode.

A material of the anode 314 is not particularly limited and may be appropriately selected depending on the intended purpose. Examples of the material include indium tin oxide (ITO), indium zinc oxide (IZO), and silver (Ag)-neodymium (Nd) alloy. Note that, in a case where a silver alloy is used, the resultant electrode becomes a high-reflective electrode, which is suitable for taking light out from the side of the cathode.

The organic EL thin film layer 340 includes an electron transporting layer 342, a light emitting layer 344, and a hole transporting layer 346. The electron transporting layer 342 is coupled to a cathode 312 and the hole transporting layer 346 is coupled to an anode 314. The light emitting layer 344 emits light when a predetermined voltage is applied between the anode 314 and the cathode 312.

The electron transporting layer 342 and the light emitting layer 344 may form a single layer. Moreover, an electron injecting layer may be disposed between the electron transporting layer 342 and the cathode 312. Furthermore, a hole injecting layer may be disposed between the hole transporting layer 346 and the anode 314.

The above-described organic EL element is a so-called "bottom emission" organic EL element, in which light is taken out from the side of the substrate (the bottom side in FIG. 10). However, the organic EL element may be a "top emission" organic EL element, in which light is taken out from the opposite side to the substrate (the bottom side in FIG. 10).

Figure 11:
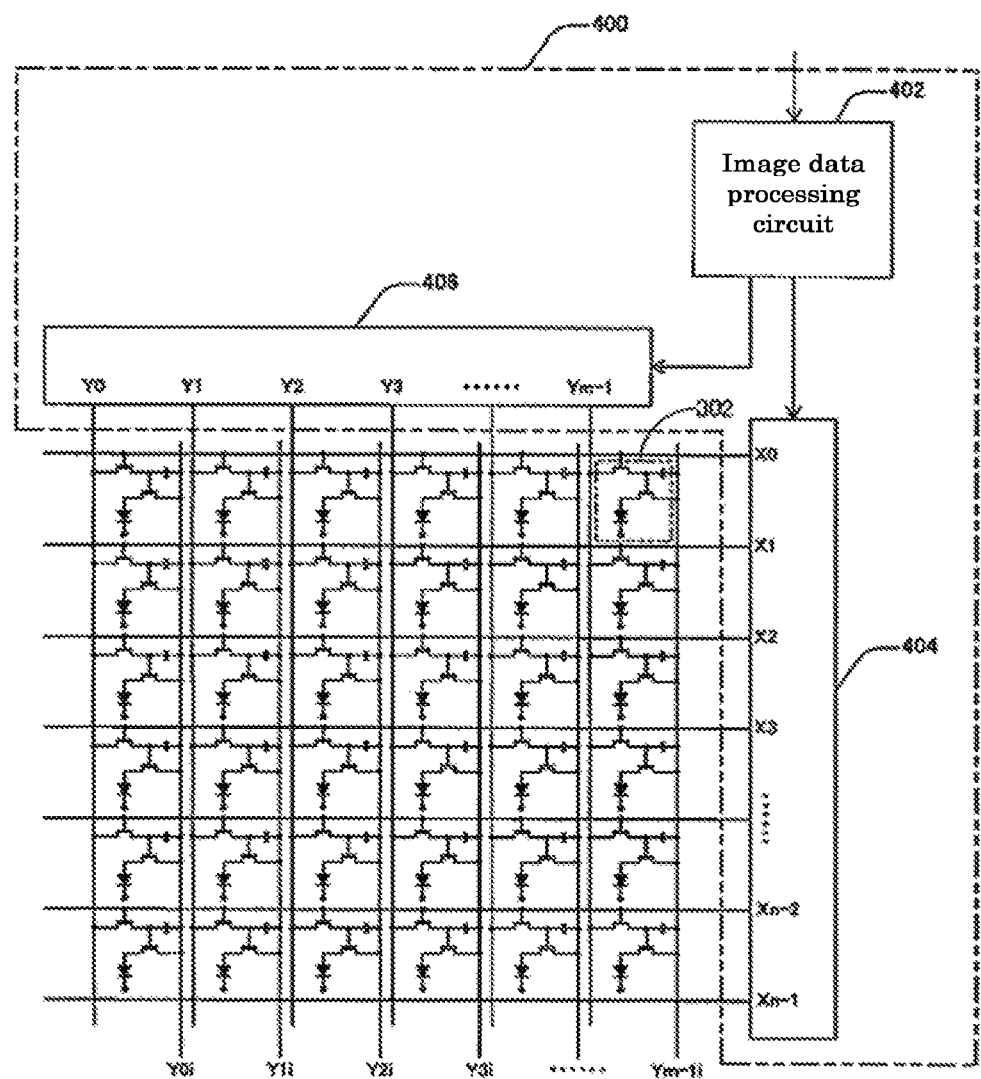
FIG. 11 is a diagram for presenting a display control device.

FIG. 11 is a schematic structural view illustrating another example of the image display device of the present disclosure.

In FIG. 11, the image display device includes display elements 302, wired lines (including scanning lines, data lines, and current supply lines), and a display control device 400.

The display control device 400 includes an image-data-processing circuit 402, a scanning-line-driving circuit 404, and a data-line-driving circuit 406.

The image-data-processing circuit 402 determines brightness of a plurality of display elements 302 in the display based on output signals of an image output circuit.

The scanning-line-driving circuit 404 individually applies voltage to "n" scanning lines according to the instructions of the image-data-processing circuit 402.

The data-line-driving circuit 406 individually applies voltage to "m" data lines according to the instructions of the image-data-processing circuit 402.

In the above embodiment, a case where the light control element is an organic EL element has been described, but the present disclosure is not limited to the above. For example, the light control element may be an electrochromic element. In this case, the display is an electrochromic display.

Figure 12:
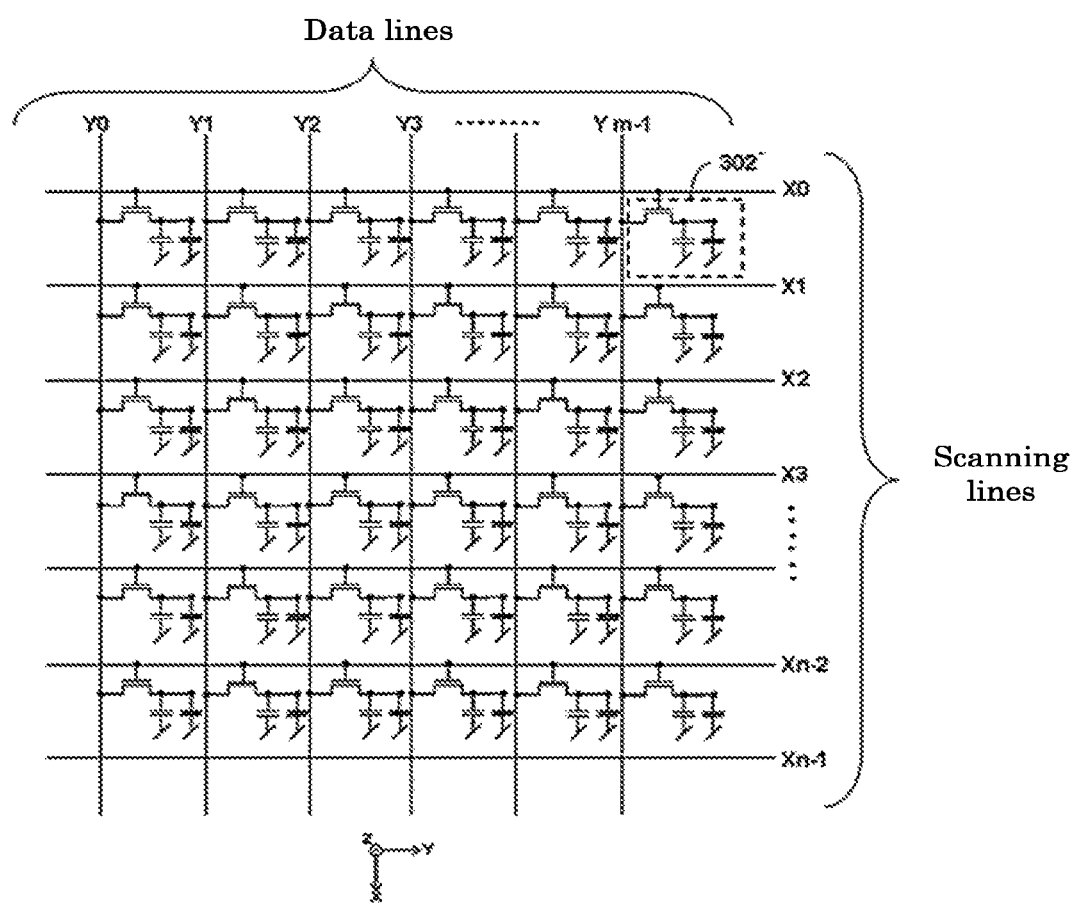
FIG. 12 is a diagram for presenting a liquid crystal display.
Figure 13:
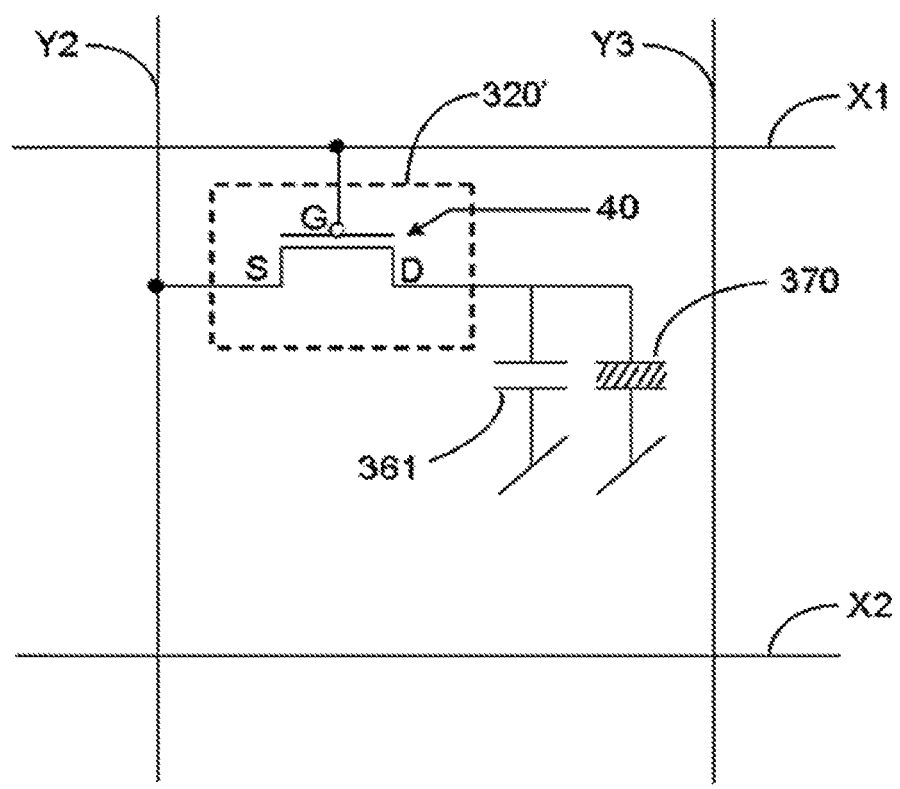
FIG. 13 is a diagram for presenting a display element in FIG. 12.

The light control element may be a liquid crystal element. In this case, the display is a liquid crystal display. As illustrated in FIG. 12, it is not necessary to provide a current supply line for a display element 302'. As illustrated in FIG. 13, the drive circuit 320' may be produced with one field-effect transistor 40, which is similar to each of the field-effect transistors 10 and 20. In the field-effect transistor 40, a gate electrode G is coupled to a predetermined scanning line and a source electrode S is coupled to a predetermined data line. Moreover, a drain electrode D is coupled to a capacitor 361 and a pixel electrode of a liquid crystal element 370.

The light control element may be an electrophoretic element, an inorganic EL element, or an electrowetting element.

As described above, a case where the system of the present disclosure is a television device has been described, but the system of the present disclosure is not limited to the television device. The system is not particularly limited, so long as the system includes the image display device serving as a device configured to display images and information. For example, the system may be a computer system in which a computer (including a personal computer) is coupled to the image display device.

A system of the present disclosure includes the display element of the present disclosure. Therefore, the system has long lifetime and is stably driven.

EXAMPLES

The present disclosure will next be described by way of Examples, but the present disclosure should not be construed as being limited to these Examples.

Example I-1

<Preparation of Field-Effect Transistor>
Preparation of Substrate

An alkali-free glass (glass substrate) was used as a substrate. The substrate was subjected to ultrasonic cleaning using a neutral detergent, pure water, and isopropyl alcohol. After the substrate was dried, the substrate was further subjected to UV-ozone treatment at 90° C. for 10 minutes.
Formation of Active Layer
—Preparation of Liquid A—

A coating liquid for forming oxide semiconductor (liquid A), which was used to form a layer of $MgIn_2O_4$ serving as layer A, was prepared.

As materials, magnesium acetylacetonate and indium acetylacetonate were weighed at a prescribed ratio (In/Mg=2 (molar ratio)) and were dissolved in toluene so that a concentration of magnesium was 0.1 M to obtain a coating liquid for forming oxide semiconductor (liquid A).
—Preparation of Liquid B—

A coating liquid for forming oxide semiconductor (liquid B), which was used to form a layer of $MgAl_2O_4$ serving as layer B, was prepared.

As materials, magnesium acetylacetonate and aluminum acetylacetonate were weighed at a prescribed ratio (Al/Mg=2 (molar ratio)) and were dissolved in toluene so that a concentration of magnesium was 0.1 M to obtain a coating liquid for forming oxide semiconductor (liquid B).

The liquid A was spin-coated on the glass substrate and was dried in an oven at 120° C. for 2 minutes. Next, the liquid B was spin-coated and was dried in an oven at 120° C. for 2 minutes. Moreover, the liquid A was spin-coated and was dried in an oven at 120° C. for 2 minutes.

Then, after the resultant was baked in an oven at 200° C. for 1 hour, patterning was performed through a photolithography process to form an active layer made of 3 layers [layer A (film thickness: 10 nm)/layer B (film thickness: 6 nm)/layer A (film thickness: 10 nm)].

Formation of Source Electrode and Drain Electrode

On the substrate on which the active layer had been formed, 100 nm of Au was deposited and patterning was performed through a photolithography process to form a source electrode and a drain electrode. A channel length was 10 μm and a channel width was 30 μm.

Formation of Gate Insulating Layer

A coating liquid for forming oxide insulating film, which was used to form a layer of $80LaO_{1.5}.20SrO$ serving as a gate insulating layer, was prepared.

Lanthanum 2-ethylhexanoate toluene solution (La: 7 wt %) (16 mL), strontium 2-ethylhexanoate toluene solution (Sr: 2 wt %) (8.8 mL), and toluene (12 mL) were mixed to obtain a coating liquid for forming oxide insulating film.

The coating liquid was spin-coated on the glass substrate and was dried in an oven at 120° C. for 2 minutes. Next, the resultant was baked in an oven at 400° C. 1 hour to obtain a gate insulating layer (thickness: 150 nm).

Moreover, patterning was performed through a photolithography process. Then, a through-hole was formed in order to have a contact with the source.drain electrode.

Formation of Gate Electrode

On the glass substrate, 100 nm of Au was deposited and patterning was performed through a photolithography process to form a gate electrode.

Finally, annealing was performed in the atmosphere at 300° C. for 1 hour to produce a field-effect transistor.

Examples I-2 to I-5

A field-effect transistor was produced in the same manner as in Example I-1 except that the layer A, the layer B, and the layer configuration of the active layer were changed as presented in Table I.

Comparative Example I-1

A field-effect transistor was produced in the same manner as in Example I-1 except that the layer configuration of the active layer was changed as presented in Table I.

Comparative Example I-2

A field-effect transistor was produced in the same manner as in Example I-4 except that the layer configuration of the active layer was changed as presented in Table I.

In the column of the layer configuration of Table I, the left-hand alphabetic character means a side at which the glass substrate is disposed and the right-hand alphabetic character means a side at which the source electrode, the drain electrode, and the gate insulating layer are disposed.

Other than the coating liquid of Example I-1, the following coating liquids were used to form each layer presented in Table I.

—Preparation of Coating Liquid for Forming Layer of $In_2O_3$—

Indium acetylacetonate was dissolved in toluene so that a concentration of indium was 0.1 M to obtain a coating liquid for forming a layer of $In_2O_3$.

—Preparation of Coating Liquid for Forming Layer of $Y_2O_3$—

Yttrium acetylacetonato was dissolved in toluene so that a concentration of yttrium was 0.1 M to obtain a coating liquid for forming a layer of $Y_2O_3$.

—Preparation of Coating Liquid for Forming Layer of $SnO_2$—

Tin 2-ethylhexanoate was dissolved in toluene so that a concentration of tin was 0.1 M to obtain a coating liquid for forming a layer of $SnO_2$.

—Preparation of Coating Liquid for Forming Layer of $MgSb_2O_6$—

As materials, magnesium acetylacetonate and triphenylantimony were weighed at a prescribed ratio (Sb/Mg=2 (molar ratio)) and were dissolved in toluene so that a concentration of magnesium was 0.1 M to obtain a coating liquid for forming a layer of $MgSb_2O_6$.

—Preparation of Coating Liquid for Forming Layer of CdO—

Cadmium chloride was dissolved in propylene glycol so that a concentration of cadmium was 0.1 M to obtain a coating liquid for forming a layer of CdO.

—Preparation of Coating Liquid for Forming Layer of $ZrO_2$—

Zirconium(IV) bis(2-ethylhexanoate) oxide.mineral spirit solution (Zr: 12%) was dissolved in toluene so that a concentration of zirconium was 0.1 M to obtain a coating liquid for forming a layer of $ZrO_2$.

—Preparation of Coating Liquid for Forming Layer of ZnO—

Zinc nitrate hexahydrate was dissolved in ethylene glycol so that a concentration of zinc was 0.1 M to obtain a coating liquid for forming a layer of ZnO.

TABLE I

| | Layer A | | Layer B | | | | |
|---|---|---|---|---|---|---|---|
| | Oxide | Film thickness (nm) | Oxide | Film thickness (nm) | Layer configuration | Mobility ($cm^2/Vs$) | Off-current (pA) |
| Example I-1 | $MgIn_2O_4$ | 10 | $MgAl_2O_4$ | 6 | ABA | 16 | 0.5 |
| Example I-2 | $In_2O_3$ | 6 | $Y_2O_3$ | 5 | ABABA | 21 | 0.8 |
| Example I-3 | $SnO_2$ | 12 | $MgSb_2O_6$ | 10 | ABA | 15 | 0.9 |
| Example I-4 | CdO | 5 | $ZrO_2$ | 5 | BABA | 19 | 1.2 |
| Example I-5 | ZnO | 8 | $Al_2O_3$ | 6 | ABA | 12 | 0.5 |
| Comparative Example I-1 | $MgIn_2O_4$ | 10 | — | 0 | A | 8 | 0.2 |
| Comparative Example I-2 | CdO | 5 | $ZrO_2$ | 5 | BA | 10 | 0.8 |

—Preparation of Coating Liquid for Forming Layer of $Al_2O_3$—

Aluminium di(s-butoxide)acetoacetic ester chelate was dissolved in toluene so that a concentration of aluminium was 0.1 M to obtain a coating liquid for forming a layer of $Al_2O_3$.

<Evaluation>

The field-effect transistors produced in Examples I-1 to I-5 and Comparative Examples I-1 to I-2 were measured for transfer characteristics (Vds=10 V). Measurement results are presented in Table I.

As presented in Table I, the TFTs of Examples I-1 to I-5 exhibited values 1.5 to 2.5 times the mobility of the TFT of Comparative Example I-1. Although the semiconductor materials, film thickness of the layer A, and film thickness of the layer B of Example I-4 were the same as those of Comparative Example I-2, the TFT of Example I-4 was about two times the mobility of that of Comparative Example I-2.

Example II-1

<Preparation of Field-Effect Transistor>

Preparation of Substrate

An alkali-free glass (glass substrate) was used as a substrate. The substrate was subjected to ultrasonic cleaning using a neutral detergent, pure water, and isopropyl alcohol. After the substrate was dried, the substrate was further subjected to UV-ozone treatment at 90° C. for 10 minutes.

Formation of Active Layer

—Preparation of Liquid A—

A coating liquid for forming oxide semiconductor (liquid A), which was used to form a layer of $MgIn_2O_4$ serving as layer A, was prepared.

As materials, magnesium acetylacetonate and indium acetylacetonate were weighed at a prescribed ratio (In/Mg=2 (molar ratio)) and were dissolved in toluene so that a concentration of magnesium was 0.1 M to obtain a coating liquid for forming oxide semiconductor (liquid A).

—Preparation of Liquid B—

A coating liquid for forming oxide semiconductor (liquid B), which was used to form a layer of $ZnGa_2O_4$: 2 at % Sn serving as layer B, was prepared.

As materials, zinc acetylacetonate, gallium acetylacetonate, and tin 2-ethylhexanoate were weighed at a prescribed ratio (Zn:Ga:Sn=1:1.96:0.04 (molar ratio)) and were dissolved in toluene so that a concentration of zinc was 0.1 M to obtain a coating liquid for forming oxide semiconductor (liquid B).

The liquid A was spin-coated on the glass substrate and was dried in an oven at 120° C. for 2 minutes. Next, the liquid B was spin-coated and was dried in an oven at 120° C. for 2 minutes. Moreover, the liquid A was spin-coated and was dried in an oven at 120° C. for 2 minutes.

Then, after the resultant was baked in an oven at 200° C. for 1 hour, patterning was performed through a photolithography process to form an active layer made of 3 layers [layer A (film thickness: 10 nm)/layer B (film thickness: 6 nm)/ layer A (film thickness: 10 nm)].

Formation of Source Electrode and Drain Electrode

On the substrate on which the active layer had been formed, 100 nm of Au was deposited and patterning was performed through a photolithography process to form a source electrode and a drain electrode. A channel length was 10 μm and a channel width was 30 μm.

Formation of Gate Insulating Layer

A coating liquid for forming oxide insulating film, which was used to form a layer of $80LaO_{1.5}.20SrO$ serving as a gate insulating layer, was prepared.

Lanthanum 2-ethylhexanoate toluene solution (La: 7 wt %) (16 mL), strontium 2-ethylhexanoate toluene solution (Sr: 2 wt %) (8.8 mL), and toluene (12 mL) were mixed to obtain a coating liquid for forming oxide insulating film.

The coating liquid was spin-coated on the glass substrate and was dried in an oven at 120° C. for 2 minutes. Next, the resultant was baked in an oven at 400° C. 1 hour to obtain a gate insulating layer (150 nm).

Moreover, patterning was performed through a photolithography process. Then, a through-hole was formed in order to have a contact with the source.drain electrode.

Formation of Gate Electrode

On the glass substrate, 100 nm of Au was deposited and patterning was performed through a photolithography process to form a gate electrode.

Finally, annealing was performed in the atmosphere at 300° C. for 1 hour to produce a field-effect transistor.

Examples II-2 to II-7

A field-effect transistor was produced in the same manner as in Example II-1 except that the layer A, the layer B, each film thickness, and the layer configuration of the active layer were changed as presented in Table II.

Comparative Example II-1

A field-effect transistor was produced in the same manner as in Example II-1 except that the layer A, the layer B, each film thickness, and the layer configuration of the active layer were changed as presented in Table II.

Comparative Example II-2

A field-effect transistor was produced in the same manner as in Example II-1 except that the layer A, the layer B, each film thickness, and the layer configuration of the active layer were changed as presented in Table II.

TABLE II

|  | Layer A | | | | Layer B | | | | | |
| --- | --- | --- | --- | --- | --- | --- | --- | --- | --- | --- |
|  | Material | $\Delta G^0$ kcal/ GFW | Band- gap eV | Film thickness of layer A nm | Material | $\Delta G^0$ kcal/ GFW | Band- gap eV | Film thickness of layer B nm | Layer configuration | Mobility $cm^2/Vs$ | Off- current pA |
| Example II-1 | $MgIn_2O_4$ | −168.3 | 3.86 | 10 | $ZnGa_2O_4$: 2at % Sn | −157.8 | 4.96 | 6 | ABA | 17 | 0.5 |
| Example II-2 | $InZn_{0.5}Zr_{0.5}O_3$ | −175.8 | 4.22 | 6 | $(Mg, Zn)SnO_4$: 2at % Sb | −169.5 | 4.64 | 5 | ABABA | 21 | 0.8 |
| Example II-3 | $CdAl_2O_4$ | −216.5 | 4.85 | 8 | $InAlO_3$: 1at % W | −164.5 | 5.33 | 10 | AB | 15 | 0.9 |

TABLE II-continued

| | Layer A | | | | Layer B | | | | | |
|---|---|---|---|---|---|---|---|---|---|---|
| | Material | $\Delta G^0$ kcal/GFW | Band-gap eV | Film thickness of layer A nm | Material | $\Delta G^0$ kcal/GFW | Band-gap eV | Film thickness of layer B nm | Layer configuration | Mobility $cm^2/Vs$ | Off-current pA |
| Example II-4 | $In_{1.6}Y_{0.4}O_3$ | −164.8 | 4.35 | 5 | $Ga_2O_3$: 3at % Zr | −158.0 | 4.62 | 5 | BABA | 19 | 0.6 |
| Example II-5 | $Ga_2O_3$ | −158.0 | 4.58 | 7 | $ZnGa_2O_4$: 2at % Sn | −157.8 | 4.96 | 8 | ABAB | 15 | 0.4 |
| Example II-6 | $Zn_2TiO_4$ | −185.0 | 3.10 | 9 | $InCa_{0.3}Zr_{0.3}O_3$ | −172.2 | 5.45 | 6 | ABA | 16 | 1.1 |
| Example II-7 | $(Mg, Zn)SnO_4$ | −169.5 | 4.53 | 12 | $(Mg, Zn)GeO_4$: 2at % Sb | −164.5 | 4.86 | 7 | ABAB | 14 | 0.7 |
| Comparative Example II-1 | $MgIn_2O_4$ | −168.3 | 3.86 | 10 | — | — | — | — | A | 8 | 0.2 |
| Comparative Example II-2 | $In_2O_3$ | −134.0 | 3.75 | 15 | $Ga_2O_3$ | −158.0 | 4.58 | 15 | BA | 12 | 500 |

In the column of the layer configuration of Table II, the left-hand alphabetic character means a side at which the glass substrate is disposed and the right-hand alphabetic character means a side at which the source electrode, the drain electrode, and the gate insulating layer are disposed. Moreover, Table II presents estimated values ($\Delta G^0$) of the layer A and the layer B.

Note that, the oxygen affinity and the band-gap in Table II were each determined by the aforementioned methods described in the specification of the present disclosure.

Other than the coating liquid of Example II-1, the following coating liquids were used to form each layer presented in Table II.

—Preparation of Coating Liquid for Forming Layer of $InZn_{0.5}Zr_{0.5}O_3$—

As materials, indium acetylacetonate, zinc acetylacetonate, and zirconium acetylacetonate were weighed at a prescribed ratio (In:Zn:Zr=1.0:0.5:0.5 (molar ratio)) and were dissolved in toluene so that a concentration of indium was 0.1 M to obtain a coating liquid for forming a layer of $InZn_{0.5}Zr_{0.5}O_3$.

—Preparation of Coating Liquid for Forming Layer of $In_{1.6}Y_{0.4}O_3$—

As materials, indium nitrate trihydrate and yttrium chloride hexahydrate were weighed at a prescribed ratio (In:Y=1.6:0.4 (molar ratio)) and were dissolved in ethylene glycol and methanol (1:1) so that a concentration of indium was 0.1 M to obtain a coating liquid for forming a layer of $In_{1.6}Y_{0.4}O_3$.

—Preparation of Coating Liquid for Forming Layer of $InAlO_3$:1 at % W—

As materials, indium acetylacetonate, aluminium di(s-butoxide) acetoacetic ester chelate, and tungsten carbonyl were weighed at a prescribed ratio (In:Al:W=1:0.99:0.01 (molar ratio)) and were dissolved in toluene so that a concentration of indium was 0.1 M to obtain a coating liquid for forming a layer of $InAlO_3$:1 at % W.

—Preparation of Coating Liquid for Forming Layer of $In_{1.4}Ca_{0.3}Zr_{0.3}O_3$—

As materials, indium acetylacetonate, calcium acetylacetonate, and zirconium acetylacetonate were weighed at a prescribed ratio (In:Ca:Zr=1.4:0.3:0.3 (molar ratio)) and were dissolved in toluene so that a concentration of indium was 0.1 M to obtain a coating liquid for forming a layer of $In_{1.4}Ca_{0.3}O_3$.

—Preparation of Coating Liquid for Forming Layer of $(Mg, Zn)SnO_4$—

As materials, magnesium acetylacetonate, zinc acetylacetonate, and tin 2-ethylhexanoate were weighed in a prescribed ratio (Mg:Zn:Sn=1:1:1 (molar ratio)) and were dissolved in toluene so that a concentration of tin was 0.1 M to obtain a coating liquid for forming a layer of $(Mg, Zn)SnO_4$.

—Preparation of Coating Liquid for Forming Layer of $Zn_2TiO_4$—

As materials, zinc acetylacetonate and titanium butoxide were weighed at a prescribed ratio (Zn:Ti=2:1 (molar ratio)) and were dissolved in toluene so that a concentration of zinc was 0.1 M to obtain a coating liquid for forming a layer of $Zn_2TiO_4$.

—Preparation of Coating Liquid for Forming Layer of (Mg, Zn) $SnO_4$:2 at % Sb—

As materials, magnesium acetylacetonate, zinc acetylacetonate, tin 2-ethylhexanoate, and triphenylantimony were weighed at a prescribed ratio (Mg:Zn:Sn:Sb=1:1:0.98:0.02 (molar ratio)) and were dissolved in toluene so that a concentration of tin was 0.1 M to obtain a coating liquid for forming a layer of (Mg, Zn) $SnO_4$:2 at % Sb.

—Preparation of Coating Liquid for Forming Layer of $CdAl_2O_4$—

As materials, cadmium chloride 2.5-hydrate and aluminium nitrate nonahydrate were weighed at a prescribed ratio (Cd:Al=1:2 (molar ratio)) and were dissolved in ethylene glycol and methanol (1:1) so that a concentration of cadmium was 0.1 M to obtain a coating liquid for forming a layer of $CdAl_2O_4$.

—Preparation of Coating Liquid for Forming Layer of (Mg, Zn) $GeO_4$:2 at % Sb—

As materials, magnesium nitrate hexahydrate, zinc nitrate hexahydrate, germanium oxide, and antimony chloride were weighed at a prescribed ratio (Mg:Zn:Ge:Sb=1:1:0.98:0.02 (molar ratio)) and were dissolved in ethylene glycol so that a concentration of zinc was 0.1 M to obtain a coating liquid for forming a layer of (Mg, Zn) $GeO_4$:2 at % Sb.

—Preparation of Coating Liquid for Forming Layer of $Ga_2O_2$:3 at % Zr—

As materials, gallium nitrate and zirconium chloride were weighed at a prescribed ratio (Ga:Zr=0.97:0.03 (molar ratio)) and were dissolved in ethylene glycol so that a concentration of gallium was 0.1 M to obtain a coating liquid for forming a layer of $Ga_2O_3$:3 at % Zr.

—Preparation of Coating Liquid for Forming Layer of $I_2O_3$—

Indium acetylacetonate was dissolved in toluene so that a concentration of indium was 0.1 M to obtain a coating liquid for forming a layer of $I_2O_3$.

—Preparation of Coating Liquid for Forming Layer of $Ga_2O_3$—

Gallium acetylacetonate was dissolved in toluene so that a concentration of gallium was 0.1 M to obtain a coating liquid for forming a layer of $Ga_2O_3$.

<Evaluation>

The field-effect transistors produced in Examples II-1 to II-7 and Comparative Examples II-1 to II-2 were measured for transfer characteristics (Vds=10 V). Measurement results are presented in Table II.

As presented in Table II, the TFTs of Examples II-1 to II-7 exhibited values 1.5 to 2.5 times the mobility of that of Comparative Example II-1. The transistor having the configuration of Comparative Example II-2 exhibited high mobility but considerably increased in off-current, which resulted in unfavorable TFT properties.

As described above, the field-effect transistor of the present disclosure can suppress off-current and can improve mobility to increase TFT properties. Moreover, the image display device of the present disclosure is suitable for displaying an image having a large area and high quality. Furthermore, the system of the present disclosure can display image information with high precision and is suitably used for television devices, computer systems, and smartphones.

Aspects of the present disclosure are as follows, for example.

<1> A field-effect transistor including:
a gate electrode, which is configured to apply gate voltage;
a source electrode and a drain electrode, which are configured to transfer an electrical signal;
an active layer, which is formed between the source electrode and the drain electrode; and
a gate insulating layer, which is formed between the gate electrode and the active layer,
wherein the active layer includes at least two kinds of oxide layers including layer A and layer B, and
wherein the active layer satisfies at least one of condition (1) and condition (2) below:
condition (1): the active layer includes 3 or more oxide layers including 2 or more of the layer A; and
condition (2): a band-gap of the layer A is lower than a band-gap of the layer B and an oxygen affinity of the layer A is equal to or higher than an oxygen affinity of the layer B.
<2> The field-effect transistor according to <1>, wherein in the condition (1), electric conductivity σA of the layer A is higher than electric conductivity σB of the layer B.
<3> The field-effect transistor according to <1>, wherein in the condition (1), carrier concentration NA of the layer A is higher than carrier concentration NB of the layer B.
<4> The field-effect transistor according to <1>, wherein in the condition (1), activation energy ΔEA of electric conduction of the layer A is lower than activation energy ΔEB of electric conduction of the layer B.
<5> The field-effect transistor according to <1>, wherein in the condition (1), bandgap EAg of the layer A is lower than bandgap EBg of the layer B.
<6> The field-effect transistor according to any one of <1> to <5>,
wherein in the condition (1), at least one of the 2 or more of the layer A is in contact with the source electrode and the drain electrode.
<7> The field-effect transistor according to any one of <1> to <6>,
wherein in the condition (1), at least one of the 2 or more of the layer A is in contact with the gate insulating layer.
<8> The field-effect transistor according to any one of <1> to <5>,
wherein in the condition (1), the active layer is an ABA stacked structure of three layers that are the layer A, the layer B, and the layer A stacked in this order, one of the layers A being in contact with the gate insulating layer and other of the layers A being in contact with the source electrode and the drain electrode.
<9> The field-effect transistor according to any one of <1> to <8>,
wherein in the condition (1), the layer A is an oxide layer including a Group A element, which is at least one selected from the group consisting of zinc, cadmium, gallium, indium, thallium, tin, lead, bismuth, titanium, niobium, tantalum, molybdenum, and tungsten, and
wherein the layer B is free of the Group A element.
<10> The field-effect transistor according to any one of <1> to <9>,
wherein in the condition (1), the layer B is an oxide layer including a Group B element, which is at least one selected from the group consisting of a Group 2A element, a Group 3A element, zirconium, hafnium, boron, aluminium, silicon, germanium, phosphorus, antimony, and tellurium.
<11> The field-effect transistor according to <1>, wherein the layer B includes a substitution dopant.
<12> The field-effect transistor according to <1> or <11>,
wherein in the condition (2), the layer A includes at least one selected from the group consisting of zinc, cadmium, gallium, indium, thallium, tin, lead, bismuth, titanium, niobium, tantalum, molybdenum, and tungsten as A1 element, and
wherein the layer A includes at least one selected from the group consisting of magnesium, calcium, strontium, barium, scandium, yttrium, lanthanoids, zirconium, hafnium, aluminium, silicon, and germanium as A2 element.
<13> The field-effect transistor according to any one of <1>, <11>, and <12>,
wherein in the condition (2), the layer B includes at least one selected from the group consisting of zinc, cadmium, gallium, indium, thallium, tin, lead, bismuth, titanium, niobium, tantalum, molybdenum, and tungsten as element B1,
wherein the layer B includes at least one selected from the group consisting of aluminium, gallium, indium, thallium, germanium, tin, lead, antimony, bismuth, titanium, niobium, tantalum, molybdenum, tungsten, rhenium, and osmium as element B3, and
wherein a Group number of the B3 element in a periodic table is larger than a Group number of the B1 element in the periodic table.
<14> The field-effect transistor according to any one of <1> and <11> to <13>,
wherein the layer B includes at least one selected from the group consisting of magnesium, calcium, strontium, barium, scandium, yttrium, lanthanoids, zirconium, hafnium, aluminium, silicon, and germanium as B2 element.
<15> The field-effect transistor according to any one of <1> and <11> to <14>,
wherein in the condition (2), before connection of the layer A with the layer B, carrier concentration NA of the layer A is lower than carrier concentration NB of the layer B, and
wherein after the connection of the layer A with the layer B, the carrier concentration NA of the layer A is higher than the carrier concentration NB of the layer B.
<16> A display element including:
a light control element configured to control light output according to a driving signal;
a driving circuit containing the field-effect transistor according to any one of <1> to <15> and configured to drive the light control element.

<17> The display device according to <16>,
wherein the light control element includes an organic electroluminescent element, an electrochromic element, a liquid crystal element, an electrophoretic element, or an electrowetting element.

<18> An image display device configured to display an image corresponding to image data, the image display device including:
a plurality of display elements arranged in a form of matrix, each of the plurality of display elements being the display element according to <16> or <17>;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

<19> A system including:
the image display device according to <18>; and
an image-data-generating device configured to generate image data based on image information to be displayed and to output the image data to the image display device.

According to the present disclosure, it is possible to solve the existing various problems and to provide: a novel field-effect transistor including an oxide semiconductor active layer and having high mobility and low off-current; a display element; a display device; and a system.

What is claimed is:

1. A field-effect transistor comprising:
a gate electrode;
a source electrode and a drain electrode;
an active layer, which is formed between the source electrode and the drain electrode; and
a gate insulating layer, which is formed between the gate electrode and the active layer;
wherein
the active layer includes at least two kinds of oxide layers including layer A and layer B,
the layer A is an oxide layer of a Group A element, which is at least one selected from the group consisting of zinc, cadmium, gallium, indium, thallium, tin, lead, bismuth, titanium, niobium, tantalum, molybdenum and tungsten,
the layer B is free of the Group A element, and
wherein the active layer satisfies condition (1):
condition (1): the active layer includes 3 or more oxide layers including 2 or more of the layer A.

2. The field-effect transistor according to claim 1, wherein electric conductivity σA of the layer A is higher than electric conductivity σB of the layer B.

3. The field-effect transistor according to claim 1, wherein a carrier concentration NA of the layer A is higher than a carrier concentration NB of the layer B.

4. The field-effect transistor according to claim 1, wherein an activation energy ΔEA of electric conduction of the layer A is lower than an activation energy ΔEB of electric conduction of the layer B.

5. The field-effect transistor according to claim 1, wherein a bandgap EAg of the layer A is lower than a bandgap EBg of the layer B.

6. The field-effect transistor according to claim 1, wherein at least one of the 2 or more of the layer A is in contact with the source electrode and the drain electrode.

7. The field-effect transistor according to claim 1, wherein at least one of the 2 or more of the layer A is in contact with the gate insulating layer.

8. The field-effect transistor according to claim 1, wherein the active layer is an ABA stacked structure of three layers that are the layer A, the layer B, and the layer A stacked in this order, one of the layers A being in contact with the gate insulating layer and other of the layers A being in contact with the source electrode and the drain electrode.

9. The field-effect transistor according to claim wherein the layer B is an oxide layer including a Group B element, which is at least one selected from the group consisting of a Group 2A element, a Group 3A element, zirconium, hafnium, boron, aluminium, silicon, germanium, phosphorus, antimony, and tellurium.

10. The field-effect transistor according to claim 1, wherein the layer B includes a substitution dopant.

11. A display element comprising:
a light control element configured to control light output according to a driving signal; and
a driving circuit containing the field-effect transistor according to claim and configured to drive the light control element.

12. The display device according to claim 11, wherein the light control element includes an organic electroluminescent element, an electrochromic element, a liquid crystal element, an electrophoretic element; or an electrowetting element.

13. An image display device configured to display an image corresponding to image data, the image display device comprising:
a plurality of display elements arranged in a form of matrix, each of the plurality of display elements being the display element according to claim 11;
a plurality of wired lines configured to individually apply gate voltage and signal voltage to the field-effect transistors in the plurality of display elements; and
a display control device configured to individually control the gate voltage and the signal voltage of the field-effect transistors via the plurality of wired lines correspondingly to the image data.

14. A system comprising:
the image display device according to claim 13; and
an image-data-generating device configured to generate image data based on image information to be displayed and to output the image data to the image display device.

15. The field-effect transistor according to claim 1, wherein
at least two layers selected from the 2 or more of the layer A are made of the same material.

* * * * *